United States Patent
Kando (10) Patent No.: US 7,411,473 B2
(45) Date of Patent: *Aug. 12, 2008

(54) ELASTIC BOUNDARY WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/624,720

(22) Filed: Jan. 19, 2007

(65) Prior Publication Data

US 2007/0176711 A1  Aug. 2, 2007

Related U.S. Application Data

(63) Continuation of application No. PCT/JP2006/009572, filed on May 12, 2006.

(30) Foreign Application Priority Data

May 20, 2005  (JP)  ............................. 2005-148064

(51) Int. Cl.
 *H03H 9/25* (2006.01)
 *H03H 9/145* (2006.01)
 *H03H 9/64* (2006.01)

(52) U.S. Cl. ................... 333/193; 333/195; 310/313 B; 310/313 D; 310/346

(58) Field of Classification Search ................ 333/193, 333/195; 310/313 R, 313 B, 313 D
See application file for complete search history.

(56) References Cited

U.S. PATENT DOCUMENTS

RE37,790 E * 7/2002 Satoh et al. ................. 333/193

(Continued)

FOREIGN PATENT DOCUMENTS

DE  4132309 A1  4/1993

(Continued)

OTHER PUBLICATIONS

Official Communication for PCT Application No. PCT/JP2006/309572; mailed on Aug. 22, 2006.

(Continued)

*Primary Examiner*—Barbara Summons
(74) *Attorney, Agent, or Firm*—Keating & Bennett, LLP (57) ABSTRACT

An elastic boundary wave device includes an IDT including laminated conductor layers disposed between a first medium and a second medium, wherein a plane that divides the IDT in half in the thickness direction defines an interface, the energy of an elastic boundary wave present on the side of the first medium of the interface is denoted as E1, and the energy of an elastic boundary wave present on the side of the second medium of the interface is denoted as E2, and wherein if the IDT included only a conductor having the highest density among the laminated conductor layers of the IDT, when the energy of an elastic boundary wave present on the side of the first medium of the interface is denoted as E1' and the energy of an elastic boundary wave present on the side of the second medium of the interface is denoted as E2', the energies of an elastic boundary wave would satisfy the relationship of E1/E2<E1'/E2' so that the sonic velocity of an elastic boundary wave in the IDT including the laminated conductor layers is equal to the sonic velocity of an elastic boundary wave if the IDT included only the conductor layer having the highest density.

22 Claims, 7 Drawing Sheets

U.S. PATENT DOCUMENTS

2006/0071579 A1     4/2006   Kando
2007/0159026 A1*   7/2007   Kando .................... 310/313 D

FOREIGN PATENT DOCUMENTS

| JP | 58-030217 A | 2/1983 |
| JP | 08-204493 A | 8/1996 |
| WO | 2004/070946 A1 | 8/2004 |

OTHER PUBLICATIONS

Campbell et al., "A Method For Estimating Optimal Crystal Cuts and Propagation Directions For Excitation of Piezoelectric Surface Waves", IEEE Trans. Sonics and Ultrason., vol. SU-15, No. 4, pp. 209-217, Oct. 1968.

"Elastic Wave Device Technology Handbook", Japan Society for Promotion of Science, Elastic Wave Device Technology, The 150th Committee, 1st Edition 1st printing, published on Nov. 30, 2001, p. 549.

"LiTaO3"; Journal of the Acoustical Society of Japan; vol. 36, No. 3, 1980, pp. 140-145.

* cited by examiner

ELASTIC BOUNDARY WAVE DEVICE

BACKGROUND OF THE INVENTION

1. Field of the Invention

The present invention relates to an elastic boundary wave device for use in a resonator, a band-pass filter, or other suitable device, and more particularly, the present invention relates to an elastic boundary wave device including an IDT disposed between a first medium and a second medium, which are made of different materials.

2. Description of the Related Art

An elastic boundary wave device includes interdigital electrodes (IDTs) that are disposed on an interface between different media. An elastic boundary wave propagates through a layered body of the different media in the elastic boundary wave device. Thus, the elastic boundary wave device does not require a complicated package structure, and has a simpler, lower-profile structure than surface acoustic wave devices.

An elastic boundary wave device that operates at a higher frequency includes IDTs that have a shorter period. This decreases the width of electrode fingers of an IDT or a reflector, and thus, increases the conductor resistance and the loss of the electrode fingers.

In an elastic boundary wave device, when the sonic velocity of an elastic boundary wave is less than the sonic velocity of a transverse wave propagating through the media disposed over and under the interface, the elastic boundary wave is confined or trapped between the upper medium and the lower medium. This reduces the propagation loss.

To enhance such a confinement effect, it is effective to provide an IDT made of a high-density metal. As described in Japanese Unexamined Patent Application Publication No. 58-30217 (Patent Document 1), many elastic boundary wave devices include IDTs made of Al. In contrast, in an elastic boundary wave device described in DE 4132309 A1 (Patent Document 2), in addition to Al, Au and Ag are described as materials used for IDTs.

In an elastic boundary wave device, the operating frequency Fi at which an IDT generates an elastic boundary wave is expressed by $Fi = V/\lambda i$ (equation (a)), where V denotes the sonic velocity of an elastic boundary wave and $\lambda i$ denotes the period of IDT. As is apparent from the equation (a), when the operating frequency Fi of an elastic boundary wave device is increased, the period $\lambda i$ of the IDT must be decreased. This also decreases the width of electrode fingers of an IDT or a reflector, thus, increasing the conductor resistance and the loss. In particular, when electrode fingers are made of a high-density conductor, the propagation loss is close to zero if the thickness of the electrode fingers is small. However, as the thickness of the electrode fingers decreases, the conductor resistance increases.

Previously, when IDTs of an elastic boundary wave device were made of Au, the electromechanical coupling coefficient $K^2$ was not sufficiently large, and the temperature coefficient of delay (TCD) was not sufficiently small.

SUMMARY OF THE INVENTION

To overcome the problems described above, preferred embodiments of the present invention provide an elastic boundary wave device that effectively confines an elastic boundary wave even at a higher operating frequency and that has a sufficiently small temperature coefficient of delay TCD.

According to a first preferred embodiment of the present invention, an elastic boundary wave device includes a first medium having a positive temperature coefficient of delay in a propagation direction of an elastic boundary wave, a second medium having a negative temperature coefficient of delay in a propagation direction of an elastic boundary wave, and an IDT including laminated conductor layers disposed between the first medium and the second medium, wherein the lamination direction of the first medium and the second medium is the thickness direction of the IDT, a plane that divides the IDT in half in the thickness direction defines an interface, the energy of an elastic boundary wave present on the first medium side of the interface is denoted as E1, and the energy of an elastic boundary wave present on the second medium side of the interface is denoted as E2, and if the IDT were composed only of a conductor layer having the highest density among the laminated conductor layers of the IDT, when the energy of an elastic boundary wave present on the first medium side of the interface is denoted as E1' and the energy of an elastic boundary wave present on the second medium side of the interface is denoted as E2', the energies of an elastic boundary wave satisfy the relationship of E1/E2<E1'/E2' so that the sonic velocity of an elastic boundary wave in the IDT composed of the laminated conductor layers is equal to the sonic velocity of an elastic boundary wave if the IDT were composed only of the conductor layer having the highest density.

Preferably, the IDT has a layered structure composed of a first conductor layer made of a metal having a density in the range of about 7,000 kg/m³ to about 22,000 kg/m³ and a second conductor layer made of a metal having a density in the range of about 1,740 kg/m³ to about 11,000 kg/m³, the density $\rho 1$ of the first conductor layer and the density $\rho 2$ of the second conductor layer satisfy the relationship of $\rho 1/\rho 2 > 1.8$, and a conductor layer disposed on the second medium side of the IDT is the first conductor layer.

Preferably, the thickness H of the second conductor layer and the electrode finger period $\lambda$ of the IDT satisfy the relationship of $0.034\lambda < H < 0.5\lambda$.

Preferably, an adherent layer is disposed at a portion at which the IDT is in contact with at least one of the first medium and the second medium.

A second preferred embodiment of the present invention provides an elastic boundary wave device that includes a first medium having a positive temperature coefficient of delay in a propagation direction of an elastic boundary wave, a second medium having a negative temperature coefficient of delay in a propagation direction of an elastic boundary wave, and an IDT disposed between the first medium and the second medium, wherein the IDT has a layered structure including a first conductor layer made of a metal having a density in the range of about 7,000 kg/m³ to about 22,000 kg/m³ and a second conductor layer made of a metal having a density in the range of about 1,740 kg/m³ to about 11,000 kg/m³, the density $\rho 1$ of the first conductor layer and the density $\rho 2$ of the second conductor layer satisfy the relationship of $\rho 1/\rho 2 > 1.8$, a conductor layer disposed on the second medium side of the IDT is the first conductor layer, and the thickness H of the second conductor layer and the electrode finger pitch $\lambda$ of the IDT satisfy the relationship of $0.034\lambda < H < 0.5\lambda$.

Preferably, an adherent layer is disposed at a portion at which the IDT is in contact with at least one of the first medium and the second medium.

In the first and second preferred embodiments, the first medium is preferably composed of one material selected from the group consisting of $LiTaO_3$, $LiNbO_3$, quartz crystal, PZT, LBO, langasite, langanite, and glass.

The second medium is preferably composed of at least one material selected from the group consisting of $SiO_2$, quartz crystal, LBO, langasite, langanite, and glass. This material is different from the material used for the first medium.

The first conductor layer is preferably a metal selected from the group consisting of Pt, Au, Cu, Ag, Ni, Fe, W, Ta, Cr, and an alloy based thereon, and the second conductor layer is preferably a metal selected from the group consisting of Mg, Al, Ti, and an alloy based thereon.

In another preferred embodiment of an elastic boundary wave device according to the present invention, the first conductor layer is Au, and the second conductor layer is made of a metal selected from the group consisting of Al, Mg, Ti, Cr, Ni, Cu, Ag, and an alloy based thereon.

In still another preferred embodiment of an elastic boundary wave device according to the present invention, the first conductor layer is Cu, and the second conductor layer is made of a metal selected from the group consisting of Al, Mg, Ti, and an alloy based thereon.

When each of the first conductor layer and the second conductor layer is the single metal described above, the film thickness of the IDT is preferably about $0.3\lambda$ or less.

In still another preferred embodiment of an elastic boundary wave device according to the present invention, the elastic boundary wave device further includes a reflector disposed between the first medium and the second medium. The reflector is made of the same electrode material as the IDT.

According to the first preferred embodiment, the IDT including a plurality of conductor layers is disposed between the first medium having a positive temperature coefficient of delay TCD in a propagation direction of an elastic boundary wave and the second medium having a negative TCD in a propagation direction of an elastic boundary wave, and the relationship of $E1/E2 < E1'/E2'$ is satisfied. Although the energy of an elastic boundary wave is greater on the second medium side than on the first medium side, since the temperature coefficient of delay TCD of the second medium is negative, for example, the placement of a high-density conductor layer on the second medium side sufficiently decreases the TCD.

Thus, when the IDT has the layered structure including the first conductor layer and the second conductor layer, an elastic boundary wave device having a sufficiently small TCD is easily provide by placing a first metal layer made of a higher-density metal on the second medium side.

In the first preferred, when the IDT has the layered structure including the first conductor layer made of a metal having a density in the range of about 7,000 kg/m$^3$ to about 22,000 kg/m$^3$ and the second conductor layer made of a metal having a density in the range of about 1,740 kg/m$^3$ to about 11,000 kg/m$^3$, when the density $\rho 1$ of the first conductor layer and the density $\rho 2$ of the second conductor layer satisfy the relationship of $\rho 1/\rho 2 > 1.8$, and when a conductor layer disposed on the second medium side of the IDT is the first conductor layer, a high-density conductor layer is disposed on the second medium side. This effectively reduces the TCD.

In the first preferred embodiment, when the relationship of $0.034\lambda < H < 0.5\lambda$ is satisfied, the TCD is further be reduced.

When an adherent layer is disposed at a portion in contact with at least one of the first medium and the second medium, the IDT effectively enhances the adhesiveness between the IDT and the at least one of the first medium and the second medium.

In the second preferred embodiment, the IDT is disposed between the first medium having a positive TCD and the second medium having a negative TCD, the IDT has a layered structure including the first conductor layer and the second conductor layer, and the first conductor layer is disposed on the second medium side. Thus, the TCD is sufficiently reduced. In addition, since the relationship of $0.034\lambda < H < 0.51\lambda$ is satisfied, the TCD is further reduced.

When an adherent layer is disposed at a portion in contact with at least one of the first medium and the second medium, the IDT effectively enhances the adhesiveness between the IDT and the at least one of the first medium and the second medium.

When the first medium is composed of one material selected from the group consisting of LiTaO$_3$, LiNbO$_3$, quartz crystal, PZT, LBO, langasite, langanite, and glass, the TCD can be positive under certain conditions. Thus, the use of a medium having a negative TCD as the second medium reduces the TCD of the entire elastic boundary wave device.

When the second medium is composed of at least one material selected from the group consisting of SiO$_2$, quartz crystal, LBO, langasite, langanite, and glass and the material is different from the material used for a medium, the TCD can be negative under certain conditions. Thus, the use of a medium having a positive TCD as the first medium reduces the TCD of the entire elastic boundary wave device. According to preferred embodiments of the present invention, the TCD is further reduced by increasing the vibrational energy of an elastic boundary wave occurring in the second medium.

According to preferred embodiments of the present invention, the metals defining the first conductor layer and the second conductor layer may be any suitable metals. For example, when the first conductor layer is made of a metal selected from the group consisting of Pt, Au, Cu, Ag, Ni, Fe, W, Ta, Cr, and an alloy based thereon, and the second conductor layer is made of a metal selected from the group consisting of Mg, Al, Ti, Cr, Ni, Cu, Ag, and an alloy based thereon, the first conductor layer and the second conductor layer can be easily made with these widely-used metals.

Furthermore, when the first conductor layer is made of Au, and the second conductor layer is made of a metal selected from the group consisting of Al, Mg, Ti, Cr, Ni, Cu, Ag, and an alloy based thereon, excellent characteristics, such as the absolute value of the temperature coefficient of frequency TCD as small as about 10 ppm/° C. or less is easily obtained.

Furthermore, when the first conductor layer is made of Cu, a metal selected from the group consisting of Al, Mg, Ti, and an alloy based thereon is preferably used as the metal for the second conductor layer, because this satisfies the relationship of $\rho 1/\rho 2 > 1.8$, to thereby reduce the absolute value of TCD.

When the first conductor layer is made of Au or Cu, as described above, the film thickness of the IDT is preferably about $0.3\lambda$ or less. This easily reduces the absolute value of TCD to about 10 ppm/° C. or less.

In preferred embodiments of the present invention, when a reflector made of the same electrode material as the IDT is further provided between the first medium and the second medium, an elastic boundary wave resonator or an elastic boundary wave resonator filter each including the reflector is easily produced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

The densities of media and materials used as electrode materials, the Euler angles of crystal, and the crystallographic axis in the present specification are described in detail below.

Density

The density of $SiO_2$ is 2210 kg/m$^3$, the acoustic characteristic impedance of a transverse wave of $SiO_2$ is 8.3×10$^6$ kg·s/m$^2$, the density of Al is 2699 kg/m$^3$, the acoustic characteristic impedance of a transverse wave of Al is 8.4×10$^6$ kg·s/m$^2$, the density of Cu is 8939 kg/m$^3$, the acoustic characteristic impedance of a transverse wave of Cu is 21.4×10$^6$ kg·s/m$^2$, the density of Ag is 10500 kg/m$^3$, the acoustic characteristic impedance of a transverse wave of Ag is 18.6×10$^6$ kg·s/m$^2$, the density of Au is 19300 kg/m$^3$, and the acoustic characteristic impedance of a transverse wave of Au is 24.0×10$^6$ kg·s/m$^2$.

Euler Angles

The Euler angles ($\phi$, $\theta$, $\psi$) that represent a cutting plane of a substrate and the iron plate direction of a boundary wave in the present specification are right-handed Euler angles described in a document of "Danseihasosi Gijyutu Handobukku (Handbook of Acoustic Wave Device Technology)" (Japan Society for the Promotion of Science, 150th Committee on the Acoustic Wave Device Technology, the first impression of the first edition, issued on Nov. 30, 1991, p. 549). Specifically, in X, Y, and Z crystallographic axes of LN, the X-axis is rotated counterclockwise $\phi$ turns about the Z-axis to provide an Xa-axis. Then, the Z-axis is rotated counterclockwise $\theta$ turns about the Xa-axis to provide a Z' axis. A plane including the Xa-axis and being normal to the Z'-axis is taken as a cutting plane of a substrate. Then, the Xa-axis is rotated counterclockwise $\psi$ turns about the Z'-axis to provide an X' axis. The direction of the X' axis is taken as a propagation direction of a boundary wave.

Crystallographic Axis

In the crystallographic axes X, Y, and Z of $LiNbO_3$, which are given as the initial values of Euler angles, the Z-axis is parallel to the c-axis, the X-axis is any one of three equivalent a-axes, and the Y-axis is normal to a plane containing the X-axis and the Z-axis.

Equivalent Euler Angles

The Euler angles ($\phi$, $\theta$, $\psi$) of $LiNbO_3$ in preferred embodiments of the present invention may be crystallographically equivalent. For example, according to a document (Journal of Acoustical Society of Japan, vol. 36, No. 3, 1980, pp. 140-

145), LiNbO$_3$ is a crystal of trigonal 3m point group. Thus, the equation [4] holds for LiNbO$_3$:

$$F(\phi, \theta, \psi) = F(60° - \phi, -\theta, \psi) \quad [4]$$
$$= F(60° + \phi, -\theta, 180° - \psi)$$
$$= F(\phi, 180° + \theta, 180° - \psi)$$
$$= F(\phi, \theta, 180° + \psi)$$

wherein F denotes a boundary wave characteristic, such as the electromechanical coupling coefficient K$_s^2$, the propagation loss, the TCF, the PFA, or a natural unidirectional property. In the natural unidirectional property of the PFA, when the propagation direction is reversed, for example, the absolute magnitude is unchanged while the sign reverses. Hence, their natural unidirectional properties are practically equivalent. While this document describes a surface wave, the same treatment applies to the crystal symmetry of a boundary wave.

For example, the propagation characteristics of a boundary wave having Euler angles of (30°, θ, ψ) are equivalent to the propagation characteristics of a boundary wave having Euler angles of (90°, 180°−θ, 180°−ψ). Furthermore, for example, the propagation characteristics of a boundary wave having Euler angles of (30°, 90°, 45°) is equivalent to the propagation characteristics of a boundary wave having the Euler angles described in a table.

The material constants for a conductor used for calculation in preferred embodiments of the present invention are the material constants for a polycrystal. Even in a crystal, such as an epitaxial film, the crystal orientation dependence of a substrate predominates over the crystal orientation dependence of a film in the boundary wave characteristics. Thus, the equation [4] can also provide the propagation characteristics of a boundary wave in a crystal without causing a practical problem.

TABLE 1

| Φ (°) | θ (°) | ψ (°) |
|---|---|---|
| 30 | 90 | 225 |
| 30 | 270 | 135 |
| 30 | 270 | 315 |
| 90 | 90 | 135 |
| 90 | 90 | 315 |
| 90 | 270 | 45 |
| 90 | 270 | 225 |
| 150 | 90 | 45 |
| 150 | 90 | 225 |
| 150 | 270 | 135 |
| 150 | 270 | 315 |
| 210 | 90 | 135 |
| 210 | 90 | 315 |
| 210 | 270 | 45 |
| 210 | 270 | 225 |
| 270 | 90 | 45 |
| 270 | 90 | 225 |
| 270 | 270 | 135 |
| 270 | 270 | 315 |
| 330 | 90 | 135 |
| 330 | 90 | 315 |
| 330 | 270 | 45 |
| 330 | 270 | 225 |

The present invention is clarified below by the description of the specific preferred embodiments of the present invention with reference to the attached drawings.

Figure 1:
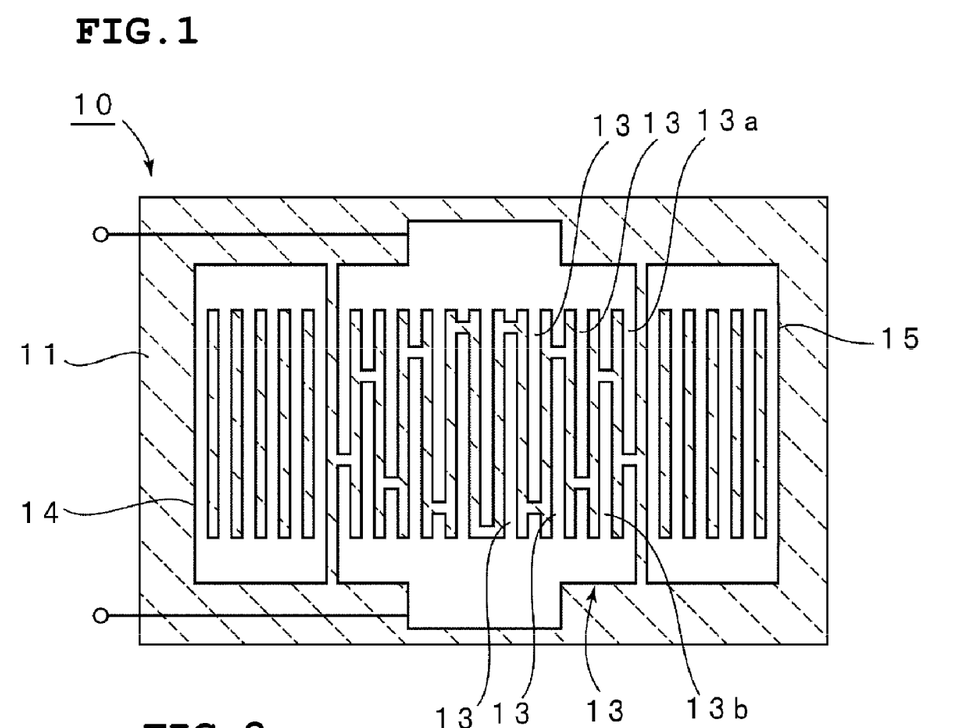
FIG. 1 is a schematic cross-sectional plan view of an elastic boundary wave device according to a preferred embodiment of the present invention.
Figure 2:
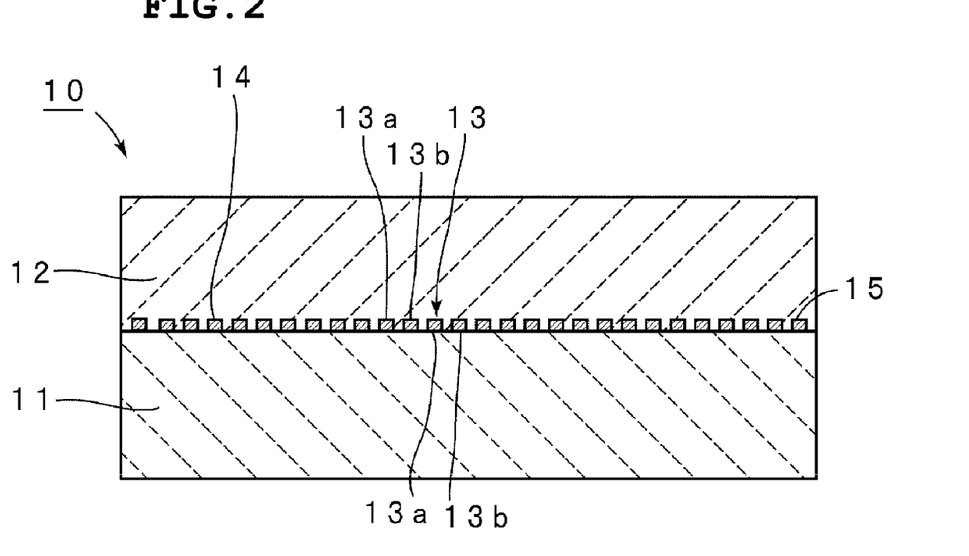
FIG. 2 is a schematic cross-sectional front view of an elastic boundary wave device according to the preferred embodiment of the present invention.

FIGS. 1 and 2 are a schematic cross-sectional plan view and a schematic cross-sectional front view of an elastic boundary wave device according to a preferred embodiment of the present invention.

An elastic boundary wave device 10 includes a laminated body including a first medium 11 and a second medium 12. The first medium 11 in the present preferred embodiment is a 15° Y-cut X-propagation (Euler angles (0°, 105°, 0°)) LiNbO$_3$ plate, which serves as a piezoelectric substance.

The second medium 12 in the present preferred embodiment is made of SiO$_2$, which serves as a nonconductive substance.

An IDT 13 and reflectors 14 and 15 are disposed on an interface between the first medium 11 and the second medium 12. In the IDT 13, a plurality of electrode fingers 13a and a plurality of electrode fingers 13b are interdigitated with each other. The plurality of electrode fingers 13a is electrically connected to one bus bar. The plurality of electrode fingers 13b is electrically connected to the other bus bar.

The IDT 13 and the reflectors 14 and 15 in the present preferred embodiment have a layered structure including a first conductor layer made of Au having a higher density and a second conductor layer made of Al having a lower density.

Figure 3:
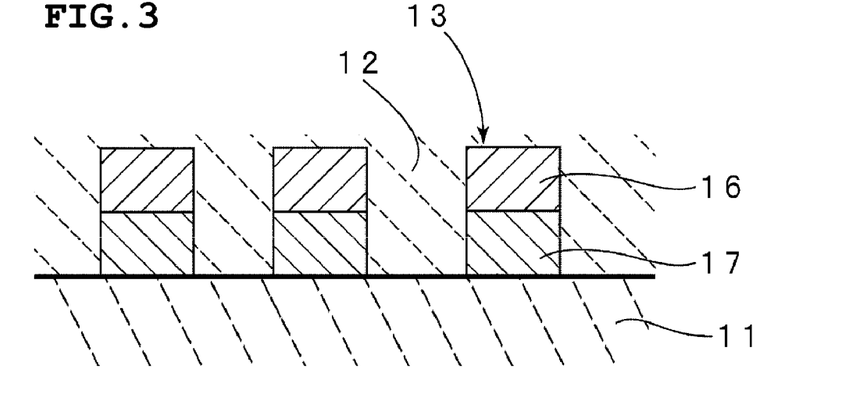
FIG. 3 is a schematic fragmentary enlarged cross-sectional front view of the structure of electrodes of an elastic boundary wave device according to a preferred embodiment of the present invention and the structure of electrodes of an elastic boundary wave device according to another preferred embodiment of the present invention.

FIG. 3 is a schematic enlarged cross-sectional view illustrating the cross-sectional structure of the electrode fingers 13a and 13b. In the electrode fingers 13a and 13b, a first conductor layer 16 and a second conductor layer 17 are stacked. The first conductor layer 16 made of Au is disposed on the side of the second medium 12 made of a nonconductive substance. The second conductor layer 17 made of Al is disposed on the side of the first medium 11, which defines a piezoelectric substance.

The reflectors 14 and 15 also have the same electrode structure as that of the IDT 13. Thus, in the reflectors 14 and 15, the first conductor layer 16 and the second conductor layer 17 are also stacked.

In the elastic boundary wave device 10 of the present preferred embodiment, the first medium 11 and the second medium 12 are configured as described above, and the IDT 13 and the reflectors 14 and 15 have the electrode structure described above. A plane that divides the IDT 13 in half in the thickness direction is defined as an interface. The energy of an elastic boundary wave present on the side of the first medium 11 of the interface is denoted as E1. The energy of an elastic boundary wave present on the second medium side of the interface is denoted as E2. If the IDT 13 were made of only a single conductor Au, which defines the first conductor layer having the highest density among the laminated conductor layers 16 and 17 of the IDT 13, when the energy of an elastic boundary wave present on the first medium side of the interface is denoted as E1' and the energy of an elastic boundary wave present on the side of the second medium 12 of the interface is denoted as E2', the energies of an elastic boundary wave would satisfy the relationship of E1/E2<E1'/E2' so that the sonic velocity of an elastic boundary wave in the IDT 13 including the laminated conductor layers 16 and 17 is equal to the sonic velocity of an elastic boundary wave if the IDT 13 were made of only Au. This relationship enables the entire elastic boundary wave device 10 to have a smaller TCD. This is specifically described below.

As illustrated in FIG. 3, the second conductor layer 17 made of Al is disposed on the side of the first medium 11, which defines a piezoelectric substance. The first conductor layer 16 made of Au is disposed on the side of the second medium which is made of SiO$_2$. The sonic velocity of an elastic boundary wave, the electromechanical coupling coefficient K$^2$, and the temperature coefficient of delay TCD were determined as a function of the thickness of a conductor layer. The conditions are described below.

Layered Structure: $SiO_2$/IDT/$LiNbO_3$

A 15° Y-cut X-propagation $LiNbO_3$ substrate was used.

IDT: the thickness of Au defining the first conductor layer 16 was about 0.05λ or variable. The thickness of the second conductor layer 17 made of Al was about 0.1λ or variable.

The first medium 11 and the second medium 12 had an infinite thickness.

These were determined according to a document of "A Method for Estimating Optimal Cuts and Propagation Directions for Excitation and Propagation Directions for Excitation of Piezoelectric Surface Waves" (J. J. Campbell and W. R. Jones, IEEE Trans. Sonics and Ultrason., Vol. SU-15 (1968) pp, 209-217). In this case, for the open boundary, the sonic velocity was determined on the assumption that the normal components of the displacement, the electric potential, the electric flux, and the density and the vertical stress were continuous at the boundary between the first medium 11 and the second medium, the boundary between the first medium 11 and the IDT 13, and the boundary between the IDT 13 and the second medium 12, the first medium 11 and the second medium 12 had an infinite thickness, and conductors defining the IDT and other components had a relative dielectric constant of 1. For the short circuit boundary, the sonic velocity was determined based on the assumption that the electric potential was zero at the boundary between the second medium and the IDT and the boundary between the IDT and the first medium. The electromechanical coupling coefficient $K^2$ was determined by the equation (1). In the equation (1), Vf denotes the sonic velocity at the open boundary.

$$K^2 = 2 \times |Vf - V|/Vf \qquad (1)$$

The temperature coefficient of delay TCD was determined by the equation (2) on the basis of the phase velocity V at 20° C., 25° C., and 30° C.

$$TCD = (V[20°C.] - V[30°C.])/V[25°C.]/10 + \alpha s \qquad (2)$$

In the equation (2), αs denotes the coefficient of linear expansion of the first medium 11 in the propagation direction of a boundary wave.

Figure 4:
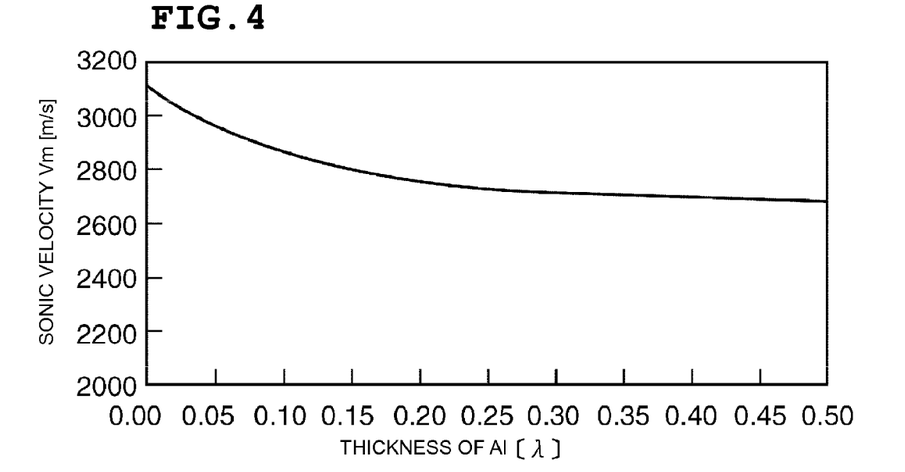
FIG. 4 is a graph illustrating a change in the sonic velocity Vm of an elastic boundary wave in the elastic boundary wave device illustrated in FIG. 1, wherein a first conductor layer made of Au is disposed on the second medium side, the thickness of the first conductor layer is maintained constant, and the thickness of Al disposed on the first medium side is changed.
Figure 5:
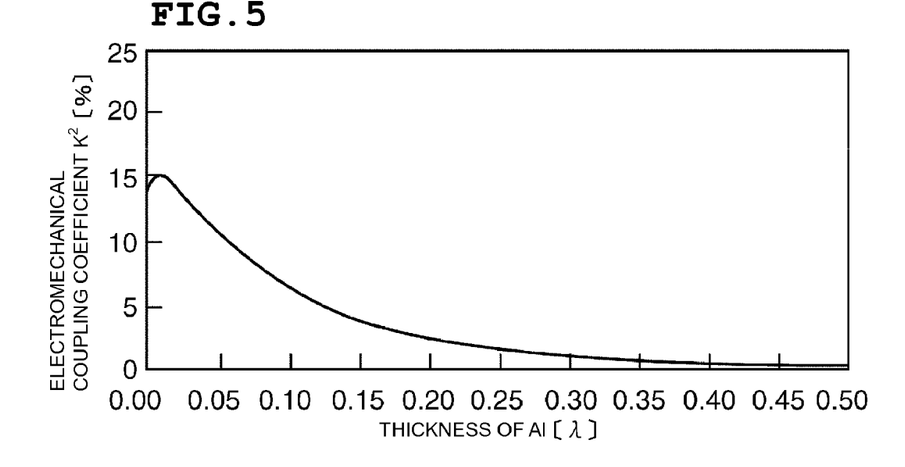
FIG. 5 is a graph illustrating a change in the electromechanical coupling coefficient $K^2$ of an elastic boundary wave in the elastic boundary wave device illustrated in FIG. 1, wherein a first conductor layer 16 made of Au is disposed on the second medium side, the thickness of the first conductor layer 16 is maintained constant, and the thickness of Al disposed on the first medium side is changed.
Figure 6:
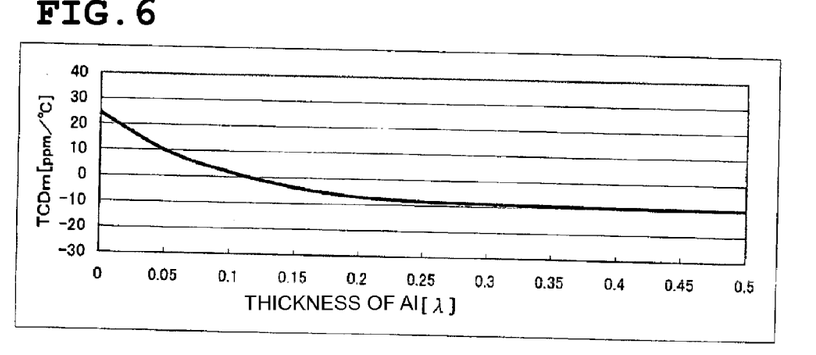
FIG. 6 is a graph illustrating a change in the temperature coefficient of delay TCD of an elastic boundary wave in the elastic boundary wave device illustrated in FIG. 1, wherein a first conductor layer made of Au is disposed on the second medium side, the thickness of the first conductor layer is maintained constant, and the thickness of Al disposed on the first medium side is changed.
Figure 7:
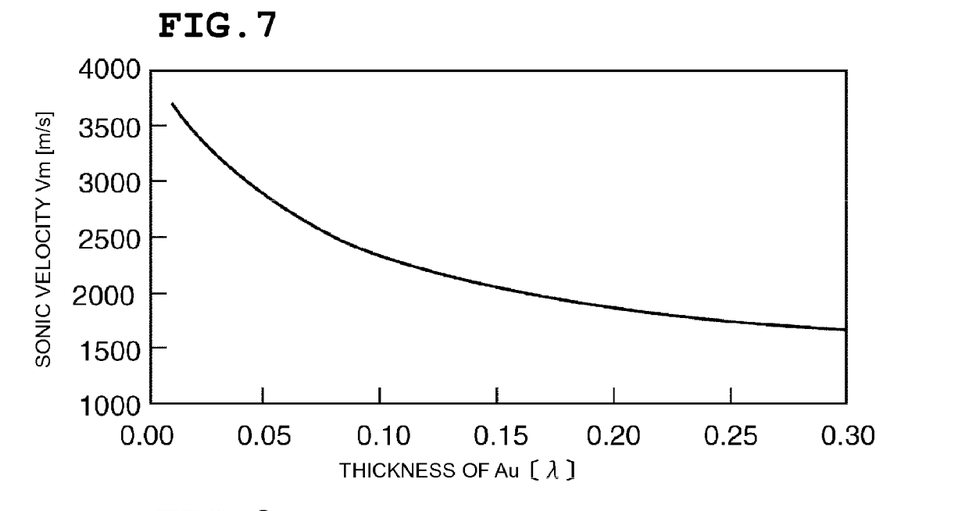
FIG. 7 is a graph illustrating a change in the sonic velocity Vm of an elastic boundary wave in the elastic boundary wave device illustrated in FIG. 1, wherein a second conductor layer made of Al is disposed on the first medium side, the thickness of the second conductor layer is maintained constant, and the thickness of Au disposed on the second medium side is changed.
Figure 8:
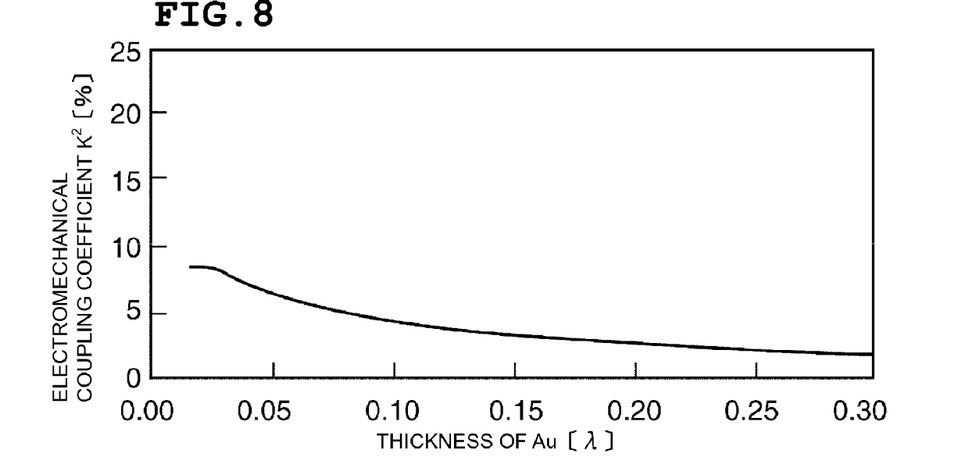
FIG. 8 is a graph illustrating a change in the electromechanical coupling coefficient $K^2$ of an elastic boundary wave in the elastic boundary wave device illustrated in FIG. 1, wherein a second conductor layer made of Al is disposed on the first medium side, the thickness of the second conductor layer is maintained constant, and the thickness of Au disposed on the second medium side is changed.
Figure 9:
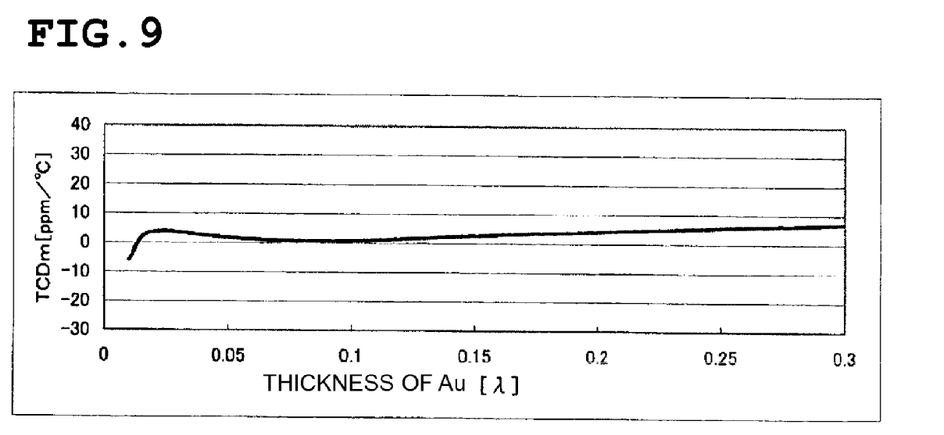
FIG. 9 is a graph illustrating a change in the temperature coefficient of delay TCD of an elastic boundary wave in the elastic boundary wave device illustrated in FIG. 1, wherein a first conductor layer made of Al is disposed on the first medium side, the thickness of the second conductor layer is maintained constant, and the thickness of Au disposed on the second medium side is changed.

FIGS. 4 to 6 illustrate the sonic velocity, the electromechanical coupling coefficient $K^2$, and the temperature coefficient of delay TCD as a function of the thickness (λ) of Al that defines the second conductor layer 17 when the thickness of the first conductor layer 16, that is, Au was set to about 0.05λ. FIGS. 7 to 9 illustrate the sonic velocity of an elastic boundary wave, the electromechanical coupling coefficient $K^2$, and the temperature coefficient of delay TCD as a function of the thickness (λ) of Au that defines the first conductor layer 16 when the thickness of Al defining the second conductor layer 17 was set to about 0.1λ.

In FIGS. 4 to 6, the characteristics at the thickness of Al=zero correspond to those of an electrode made of only Au. As shown in FIG. 6, the temperature coefficient of delay TCD can be controlled by providing the second conductor layer 17 made of Al between the first medium 11 made of $LiNbO_3$ and the first conductor layer 16 made of Au, in other words, by setting the thickness of Al to be greater than zero.

This may be restated as follows. A plane that divides the IDT 13 in half in the thickness direction defines an interface. The energy of an elastic boundary wave present on the side of the first medium 11 of the interface is denoted as E1. The energy of an elastic boundary wave present on the side of the second medium 12 of the interface is denoted as E2. If the IDT 13 were made of only a single conductor Au, which defines the first conductor layer having the highest density among the laminated conductor layers 16 and 17 of the IDT 13, when the energy of an elastic boundary wave present on the first medium side of the interface is denoted as E1' and the energy of an elastic boundary wave present on the side of the second medium 12 of the interface is denoted as E2', the energies of an elastic boundary wave satisfy the relationship of E1/E2<E1'/E2' so that the sonic velocity of an elastic boundary wave in the IDT 13 including the laminated conductor layers 16 and 17 is equal to the sonic velocity of an elastic boundary wave if the IDT 13 were made of only Au. This relationship enables the temperature coefficient of delay TCD to be reduced.

More specifically, the relationship of 0.034λ<H, where H denotes the thickness of the second conductor layer 17 made of Al, is preferred because this relationship provides a TCD in the range of about ±20 ppm/° C. More preferably, the relationship of 0.064λ<H<0.2λ results in the TCD of about ±10 ppm/° C. Still more preferably, the relationship of 0.083λ<H<0.144λ results in about ±5 ppm/° C. In particular, H in the vicinity of about 0.118λ provides a TCD close to zero.

The upper limit of the thickness of Al by photolithography is about 0.5λ because of the threshold value taking the aspect ratio into account.

Furthermore, as shown in FIG. 9, the TCD does not change significantly even when the thickness of the first conductor layer 16 made of Au is changed.

Figure 10:
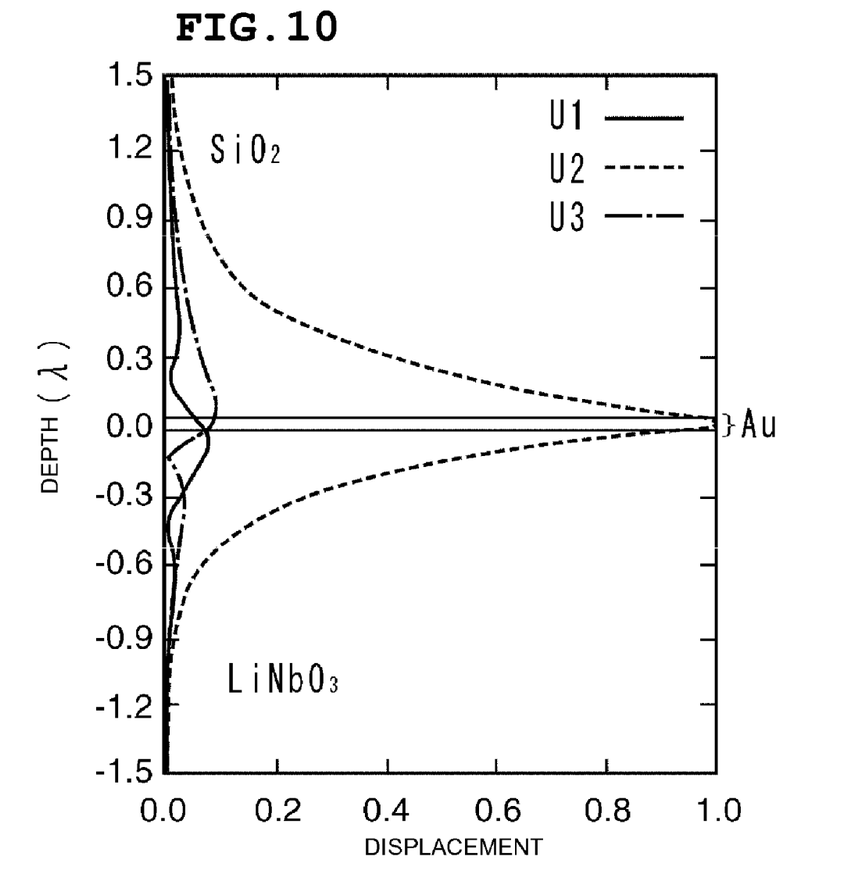
FIG. 10 is a schematic graph of the displacement distribution of an elastic boundary wave in a comparative elastic boundary wave device including an IDT made only of Au.
Figure 11:
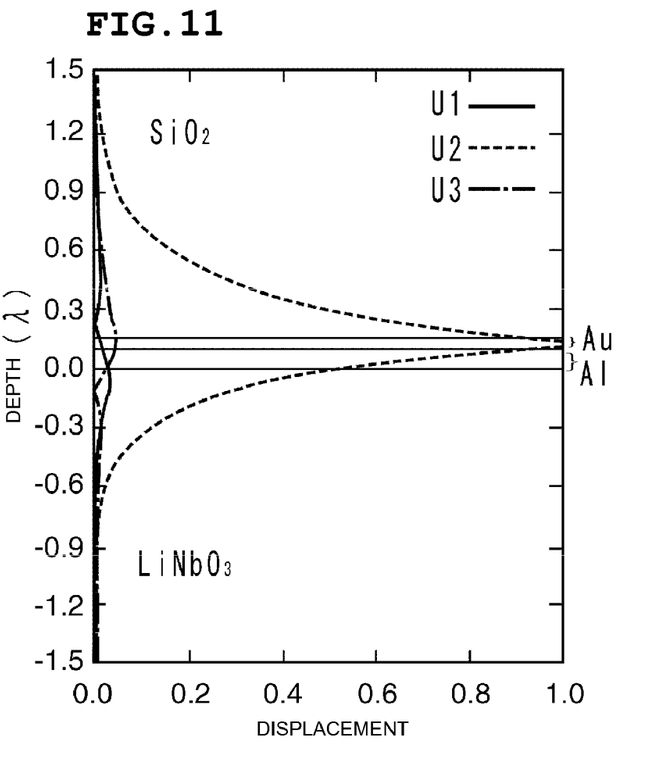
FIG. 11 is a graph illustrating the displacement distribution of an elastic boundary wave in an elastic boundary wave device according to a preferred embodiment in which a second conductor layer made of Al is disposed on the side of a first medium $LiNbO_3$ and a second conductor layer made of Au is disposed on the side of $SiO_2$.

FIG. 10 is a schematic graph of the displacement distribution of an elastic boundary wave when the thickness of Au=0.05λ and the thickness of Al=zero (U1=longitudinal wave component, U2=SH wave component, U3=SV wave component; U1 to U3 are partial wave components defining the elastic boundary wave). FIG. 11 is a graph illustrating the displacement distribution of an elastic boundary wave in an elastic boundary wave device when the thickness of Au=0.05λ and the thickness of Al=0.1λ (U1=longitudinal wave component, U2=SH wave component, U3=SV wave component; U1 to U3 are partial wave components defining the elastic boundary wave). In FIG. 10, the density of the first medium 11 is about 4640 kg/m$^3$ and the density of the second medium 12 is about 2210 kg/m$^3$. In FIG. 10, the IDT does not have a layered structure including a plurality of conductors and is made of a single conductor. The energy of an elastic boundary wave is proportional to $\rho U^2$, wherein U denotes the amplitude and ρ denotes the density of the IDT. Accordingly, the E1'/E2' is about 1.1. The E1/E2 determined from FIG. 11 is about 0.5. Thus, in the present preferred embodiment, the relationship of E1/E2<E1'/E2' is satisfied.

As shown in FIG. 11, since the high-density first conductor layer 16 made of Au is disposed on the side of the second medium 12, the center of vibrational energy distribution occurs on the side of the second medium 12. Thus, $SiO_2$ strongly compensates a positive TCD of the first medium 11 made of a piezoelectric substance because of its negative TCD. The TCD of the entire elastic boundary wave device is therefore effectively reduced.

The present invention can be applied not only to the elastic boundary wave device 10 functioning as an elastic boundary wave resonator, but also to resonators or filters having various structures. Specifically, the present invention can also be applied to various filters or switches utilizing an elastic boundary wave, such as a ladder filter, a longitudinally coupled resonator filter, a transversely coupled resonator filter, a transversal filter, an elastic boundary wave optical switch, and an elastic boundary wave light filter.

The electrode material is not limited to Au and Al and may be another conducting material, such as Pt, Ag, Cu, Ni, Ti, Fe, W, or Ta or may be an alloy primarily including these conducting materials.

When the IDT has a layered structure including a first conductor layer and a second conductor layer, the first conductor layer is made of a high-density metal having a density of about 7,000 kg/m³ to about 22,000 kg/m³, such as Au, and the second conductor layer is made of a low-density metal having a density in the range of about 1,740 kg/m³ to about 11,000 kg/m³, such as Al. The metal defining each conductor layer of the layered structure including the first conductor layer and the second conductor layer may be any metal, provided that the requirements for the densities of the metals defining the first conductor layer and the second conductor layer and for the density ratio of the first conductor layer to the second conductor layer $\rho 1/\rho 2>1.8$ are satisfied.

Examples of the metals of the first conductor layer and the second conductor layer include a combination of a metal of the first conductor layer selected from the group consisting of Pt, Au, Cu, Ag, Ni, Fe, W, Ta, Cr, and an alloy based thereon and a metal of the second conductor layer selected from the group consisting of Mg, Al, Ti, Cr, Ni, Cu, Ag, and an alloy based thereon.

Furthermore, when the first conductor layer is made of Au, examples of the combination that satisfies the conditions described above include a combination with the metal of the second conductor layer selected from the group consisting of Al, Mg, Ti, Cr, Ni, Cu, Ag, and an alloy based thereon. Furthermore, when the first conductor layer is made of Cu, examples of the combination include a combination with the metal of the second conductor layer selected from the group consisting of Al, Mg, Ti, and an alloy based thereon. In the combination when the first conductor layer is made of Au or in the combination when the first conductor layer is made of Cu, the film thickness of the IDT is preferably about $0.3\lambda$ or less. This reduces the absolute value of TCD to about 10 ppm/° C. or less.

Figure 12:
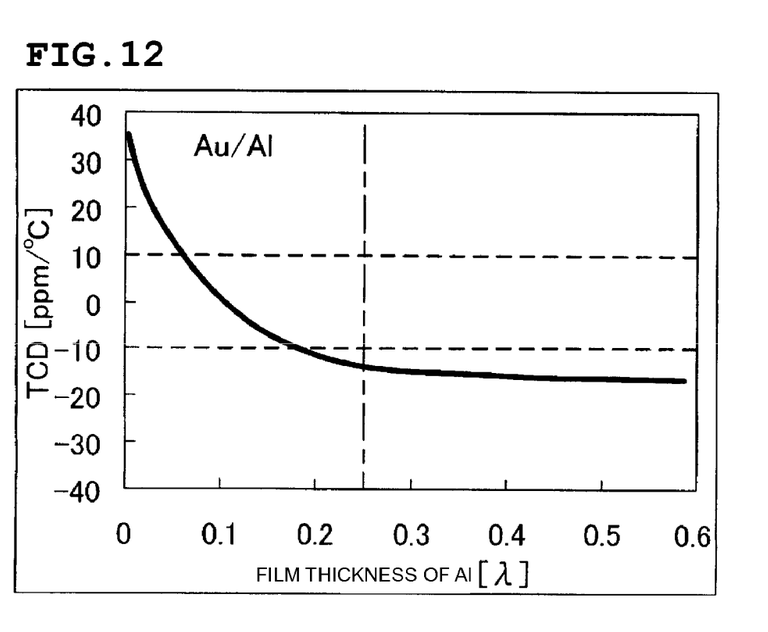
FIG. 12 is a graph illustrating a change in TCD as a function of the film thickness of Al when the second conductor layer is made of Al and the first conductor layer is made of Au having a thickness of about 0.05λ.
Figure 13:
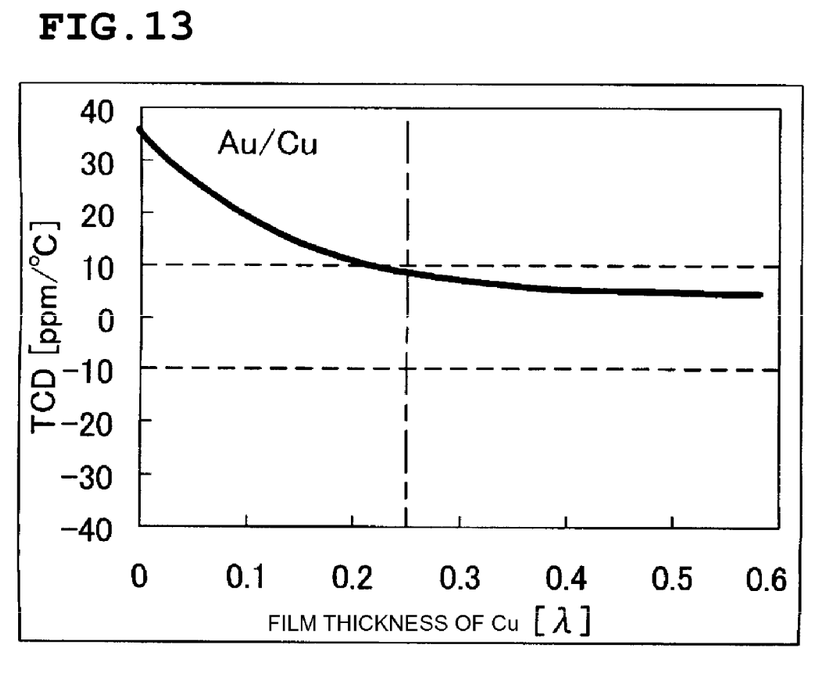
FIG. 13 is a graph illustrating a change in TCD as a function of the film thickness of Cu when the second conductor layer is made of Cu and the first conductor layer is made of Au having a thickness of about 0.05λ.
Figure 14:
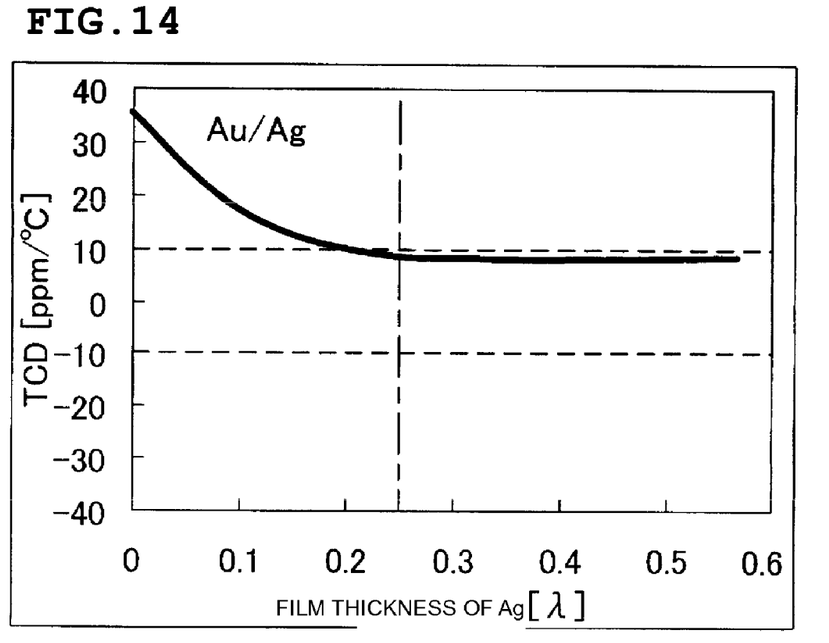
FIG. 14 is a graph illustrating a change in TCD as a function of the film thickness of Ag when the second conductor layer is made of Ag and the first conductor layer is made of Au having a thickness of about 0.05λ.

FIGS. 12 to 14 are graphs illustrating a change in TCD as a function of the film thickness of a second conductor layer in an IDT, when an elastic boundary wave device is produced as in the elastic boundary wave device with which the results illustrated in FIGS. 4 to 6 are obtained, except that the first conductor layer and the second conductor layer have the structure described below.

Specifically, FIGS. 12 to 14 illustrate a change in TCD as a function of the normalized film thickness of Al, when the first conductor layer is made of Au having a film thickness of about $0.05\lambda$ and the second conductor layer is made of Al.

FIGS. 13 and 14 illustrate a change in TCD as a function of the thickness of a Cu film or an Ag film, when the upper second conductor layer is made of Cu or Ag. In FIGS. 13 and 14, the film thickness of the first conductor layer made of Au is also about $0.05\lambda$.

In FIGS. 12 to 14, the vertical alternate long and short dashed line indicates a point at which the Al film, the Cu film, and the Ag film of the second conductor layer have a thickness of about $0.25\lambda$. At this point, the total film thickness of the first conductor layer and the second conductor layer is about $0.3\lambda$.

As shown in FIGS. 12 to 14, when the film thickness of the IDT is about $0.3\lambda$ or less, as the density of the metal of the second conductor layer increases from Al to Cu to Ag, a region, or the film thickness range of the second conductor layer, in which the absolute value of TCD is about 10 ppm/° C. or less decreases. This phenomenon results from the density ratio of the first conductor layer to the second conductor layer. The density ratio of Au/Ag is 1.83.

In general, the region in which the absolute value of TCD is about 10 ppm/° C. or less is the region in which the TCD is outstanding. Thus, an elastic boundary wave device having the absolute value of TCD greater than about 10 ppm/° C. should not be used. Depending on the requirements specification, an elastic boundary wave device having the characteristic out of the range described above can be used. In other words, the absolute value of TCD of about 10 ppm/° C. or less represents a preferred numerical range.

Figure 15:
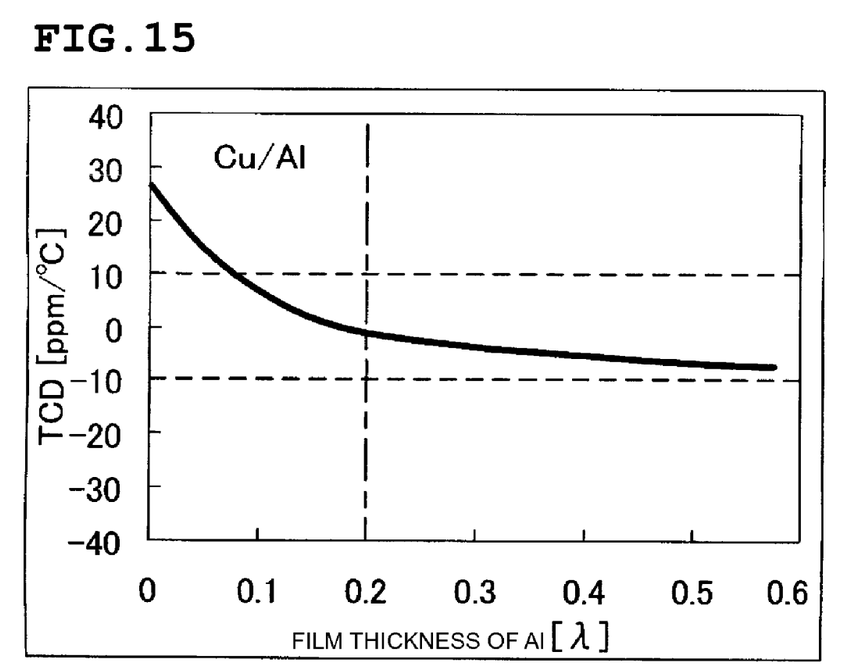
FIG. 15 is a graph illustrating a change in TCD as a function of the normalized film thickness of Al when the first conductor layer is made of Al and the second conductor layer is made of Cu having a thickness of about 0.1λ.
Figure 16:
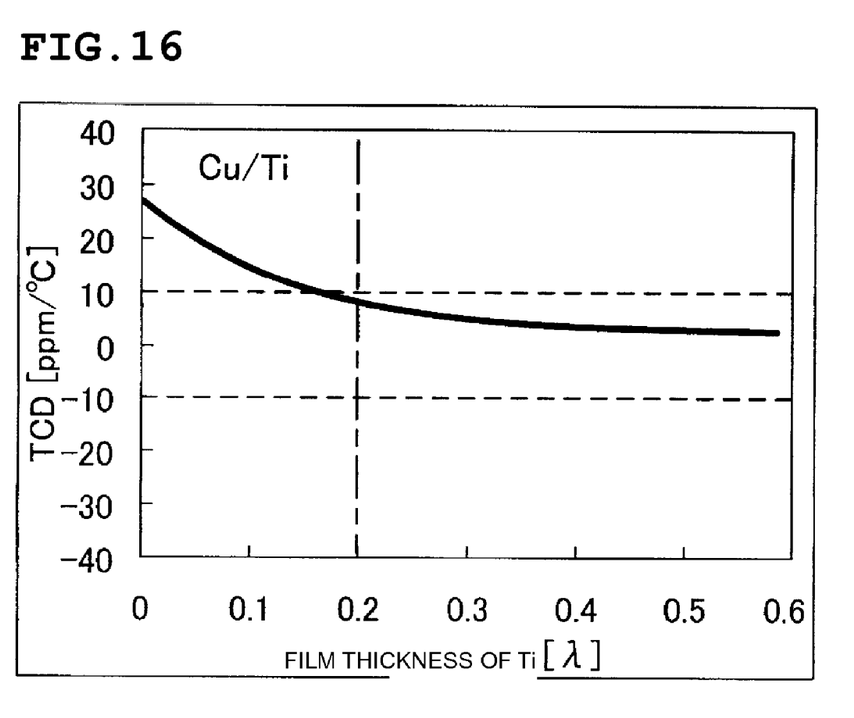
FIG. 16 is a graph illustrating a change in TCD as a function of the normalized film thickness of Ti when the second conductor layer is made of Ti and the first conductor layer is made of Cu having a thickness of about 0.1λ.

FIGS. 15 and 16 are graphs illustrating a change in TCD as a function of the film thickness of an Al film or a Ti film when the first conductor layer is made of Cu having a film thickness of about $0.1\lambda$ and the second conductor layer is made of Al or Ti.

In FIGS. 15 and 16, the vertical alternate long and short dashed line indicates a point at which the film thickness of the second conductor layer is about $0.2\lambda$. At this point, the total film thickness of the first conductor layer and the second conductor layer is about $0.3\lambda$.

The reason that the thickness of the first conductor layer is about $0.1\lambda$ when the first conductor layer is made of Cu is that the density of Cu is 8.93 and is approximately half the density of Au, which is 19.3. More specifically, in an elastic boundary wave, the distribution of energy concentration depends on the weight of an electrode. To equalize the energy concentration of the first conductor layer with that in FIGS. 12 to 14, the normalized film thickness of Cu in FIGS. 15 and 16 was set to about $0.1\lambda$.

As shown in FIGS. 15 and 16, when the film thickness of the IDT is about $0.5\lambda$ or less or about $0.3\lambda$ or less and the first conductor layer is made of Cu, as the density of the metal of the second conductor layer increases, a region in which an outstanding TCD is achieved also decreases. This phenomenon results from the density ratio $\rho 1/\rho 2$ of the first conductor layer to the second conductor layer. The density ratio of Cu/Ti is 1.98, which satisfies $\rho 1/\rho 2>1.8$.

In addition, a thin layer of Ti, Cr, NiCr, Ni, ZnO, or other suitable material may be stacked on the first conductor layer or the second conductor layer to enhance the adhesiveness or the electric power resistance. In this case, the thin layer may be disposed between the first conductor layer or the second conductor layer and the first medium layer or the second medium layer, or between the first conductor layer and the second conductor layer. In particular, when the thin layer is disposed as an adherent layer at a portion where the IDT is in contact with at least one of the first medium and the second medium, the adhesiveness between the IDT and the at least one of the first medium and the second medium is effectively enhanced. Since the thin layer is provided only for adhesiveness or to prevent diffusion, the film thickness of the thin layer is in the range of about 1 nm to about 30 nm.

Furthermore, in another preferred embodiment of the present invention, in addition to the first conductor layer and the second conductor layer, at least one additional conductor layer, including a third conductor layer, may be provided. In this case, the material used for the third conductor layer may be the same as or different from the material used for the first conductor layer or the second conductor layer. Thus, for example, the structure of electrodes may be Al/Au/Al. This structure provides an elastic boundary wave device in which the electromechanical coupling coefficient $K^2$ is moderately increased because of the presence of Au, the temperature coefficient of delay TCD is reduced to some extent, and electrode fingers have a small conductor resistance.

Furthermore, while the first medium 11 and the second medium 12 are stacked, at least one additional medium may be stacked. When another medium is stacked on the first medium 11 or the second medium 12, this third medium may be disposed between the first medium and the second medium. In this case, when the first conductor layer made of a higher-density electrode material is disposed on the side of a medium made of $SiO_2$ or other suitable material and having a negative TCD, the TCD of the whole device is reduced.

Furthermore, in another preferred embodiment of the present invention, before the formation of the second medium, the IDT may be adjusted by various methods, such as reverse sputtering, ion beam milling, reactive ion etching, and wet etching, to control the frequency. In addition, when a layered structure of second medium/third medium/IDT/first medium is used, the thickness of the third medium may be adjusted by the ion beam milling or etching, or an additional film may be formed by a deposition method, such as sputtering or vapor deposition, to control the frequency.

The first medium and the second medium may be made of various materials. Such materials include Si, glass, $SiO_2$, SiC, ZnO, $Ta_2O_5$, PZT, AlN, $Al_2O_3$, $LiTaO_3$, $LiNbO_3$, and KN (potassium niobate). In particular, when a piezoelectric substance is used as the first medium 11, in addition to $LiNb_2O_3$, various piezoelectric materials, such as ZnO, $Ta_2O_5$, PZT, and $LiTaO_3$, may be used.

Furthermore, when a dielectric material is used as the second medium 12, examples of such a dielectric material include, in addition to $SiO_2$, glass, SiC, AlN, and $Al_2O_3$. As described above, because a piezoelectric substance has a positive TCD, a dielectric material having a negative TCD is preferably used as a material of the second medium 12 to reduce the TCD. Examples of the dielectric material having a negative TCD include, in addition to $SiO_2$, quartz crystal, lithium tetraborate (LBO), langasite, langanite, and glass.

In another preferred embodiment of the present invention, a laminated body including a first medium and a second medium or a laminated body further including a third medium preferably has an outer protective layer to increase the strength or prevent the intrusion of a corrosive gas. The protective layer may be made of various materials, including, but not limited to, polyimide, an epoxy resin, an inorganic insulating material, such as titanium oxide, aluminum nitride, or aluminum oxide, and a metal, such as Au, Al, or W. Furthermore, with or without the protective layer, an elastic boundary wave device may be encapsulated.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic boundary wave device comprising:
   a first medium having a positive temperature coefficient of delay in a propagation direction of an elastic boundary wave;
   a second medium having a negative temperature coefficient of delay in a propagation direction of an elastic boundary wave; and
   an IDT including laminated conductor layers disposed between the first medium and the second medium; wherein
   a lamination direction of the first medium and the second medium is the thickness direction of the IDT, a plane that divides the IDT in half in the thickness direction defines an interface, energy of an elastic boundary wave present on the first medium side of the interface is denoted as E1, and energy of an elastic boundary wave present on the second medium side of the interface is denoted as E2; and
   if the IDT included only of a conductor layer of a single metal having the highest density among the laminated conductor layers of the IDT, when the energy of an elastic boundary wave present on the first medium side of the interface is denoted as E1' and the energy of an elastic boundary wave present on the second medium side of the interface is denoted as E2', the energies of an elastic boundary wave would satisfy the relationship of E1/E2<E1'/E2' so that the sonic velocity of an elastic boundary wave in the IDT including the laminated conductor layers is equal to the sonic velocity of an elastic boundary wave if the IDT included only of the conductor layer having the highest density.

2. The elastic boundary wave device according to claim 1, wherein the IDT has a layered structure including a first conductor layer made of a metal having a density in the range of about 7,000 $kg/m^3$ to about 22,000 $kg/m^3$ and a second conductor layer made of a metal having a density in the range of about 1,740 $kg/m^3$ to about 11,000 $kg/m^3$;
   the density $\rho 1$ of the first conductor layer and the density $\rho 2$ of the second conductor layer satisfy the relationship of $\rho 1/\rho 2 > 1.8$; and
   a conductor layer disposed on the second medium side of the IDT is the first conductor layer.

3. The elastic boundary wave device according to claim 2, wherein the thickness H of the second conductor layer and the electrode finger period $\lambda$ of the IDT satisfy the relationship of $0.034\lambda < H < 0.5\lambda$.

4. The elastic boundary wave device according to claim 2, further comprising an adherent layer disposed at a portion at which the IDT is in contact with at least one of the first medium and the second medium.

5. The elastic boundary wave device according to claim 2, wherein the first conductor layer is made of a metal selected from the group consisting of Pt, Au, Cu, Ag, Ni, Fe, W, Ta, Cr, and an alloy based thereon; and
   the second conductor layer is made of a metal selected from the group consisting of Mg, Al, Ti, Cr, Ni, Cu, Ag, and an alloy based thereon.

6. The elastic boundary wave device according to claim 2, wherein the first conductor layer is made of Au, and the second conductor layer is made of a metal selected from the group consisting of Al, Mg, Ti, Cr, Ni, Cu, Ag, and an alloy based thereon.

7. The elastic boundary wave device according to claim 6, wherein the film thickness of the IDT is about $0.3\lambda$ or less.

8. The elastic boundary wave device according to claim 2, wherein the first conductor layer is made of Cu, and the second conductor layer is made of a metal selected from the group consisting of Al, Mg, Ti, and an alloy based thereon.

9. The elastic boundary wave device according to claim 8, wherein the film thickness of the IDT is about $0.3\lambda$ or less.

10. The elastic boundary wave device according to claim 1, wherein the first medium is composed of one material selected from the group consisting of $LiTaO_3$, $LiNbO_3$, quartz crystal, PZT, LBO, langasite, langanite, and glass.

11. The elastic boundary wave device according to claim 1, wherein the second medium is composed of at least one material selected from the group consisting of $SiO_2$, quartz crystal, LBO, langasite, langanite, and glass, the material being different from a material used for the first medium.

12. The elastic boundary wave device according to claim 1, further comprising a reflector disposed between the first medium and the second medium, the reflector being made of the same electrode material as the IDT.

13. An elastic boundary wave device comprising:

a first medium having a positive temperature coefficient of delay in a propagation direction of an elastic boundary wave;

a second medium having a negative temperature coefficient of delay in a propagation direction of an elastic boundary wave; and an IDT disposed between the first medium and the second medium; wherein the IDT has a layered structure including a first conductor layer made of a metal having a density in the range of about 7,000 kg/m³ to about 22,000 kg/m³ and a second conductor layer made of a metal having a density in the range of about 1,740 kg/m³ to about 11,000 kg/m³;

the density $\rho 1$ of the first conductor layer and the density $\rho 2$ of the second conductor layer satisfy the relationship of $\rho 1/\rho 2 < 1.8$;

a conductor layer disposed on the second medium side of the IDT is the first conductor layer, and the thickness H of the second conductor layer and the electrode finger period $\lambda$ of the IDT satisfy the relationship of $0.034\lambda < H < 0.5\lambda$.

14. The elastic boundary wave device according to claim 13, further comprising an adherent layer disposed at a portion at which the IDT is in contact with at least one of the first medium and the second medium.

15. The elastic boundary wave device according to claim 13, wherein the first medium is composed of one material selected from the group consisting of $LiTaO_3$, $LiNbO_3$, quartz crystal, PZT, LBO, langasite, langanite, and glass.

16. The elastic boundary wave device according to claim 13, wherein the second medium is composed of at least one material selected from the group consisting of $SiO_2$, quartz crystal, LBO, langasite, langanite, and glass, the material being different from the material used for the first medium.

17. The elastic boundary wave device according to claim 13, wherein the first conductor layer is made of a metal selected from the group consisting of Pt, Au, Cu, Ag, Ni, Fe, W, Ta, Cr, and an alloy based thereon, and the second conductor layer is made of a metal selected from the group consisting of Mg, Al, Ti, Cr, Ni, Cu, Ag, and an alloy based thereon.

18. The elastic boundary wave device according to claim 13, wherein the first conductor layer is made of Au, and the second conductor layer is made of a metal selected from the group consisting of Al, Mg, Ti, Cr, Ni, Cu, Ag, and an alloy based thereon.

19. The elastic boundary wave device according to claim 18, wherein the film thickness of the IDT is about $0.3\lambda$ or less.

20. The elastic boundary wave device according to claim 13, wherein the first conductor layer is made of Cu, and the second conductor layer is made of a metal selected from the group consisting of Al, Mg, Ti, and an alloy based thereon.

21. The elastic boundary wave device according to claim 20, wherein the film thickness of the IDT is about $0.3\lambda$ or less.

22. The elastic boundary wave device according to claim 13, further comprising a reflector disposed between the first medium and the second medium, the reflector being made of the same electrode material as the IDT.

* * * * *